US012553145B2

(12) United States Patent
Knerer et al.

(10) Patent No.: US 12,553,145 B2
(45) Date of Patent: Feb. 17, 2026

(54) APPARATUS AND METHOD FOR PRODUCING A DOPED MONOCRYSTALLINE ROD MADE OF SILICON

(71) Applicant: SILTRONIC AG, Munich (DE)

(72) Inventors: Dieter Knerer, Haiming (DE); Patrick Eschenbacher-Bladt, Burghausen (DE); Ulf Gattermann, Burghausen (DE)

(73) Assignee: SILTRONIC AG, Munich (DE)

( * ) Notice: Subject to any disclaimer, the term of this patent is extended or adjusted under 35 U.S.C. 154(b) by 367 days.

(21) Appl. No.: 18/548,933

(22) PCT Filed: Mar. 7, 2022

(86) PCT No.: PCT/EP2022/055672

§ 371 (c)(1),
(2) Date: Sep. 5, 2023

(87) PCT Pub. No.: WO2022/194586

PCT Pub. Date: Sep. 22, 2022

(65) Prior Publication Data

US 2024/0150927 A1 May 9, 2024

(30) Foreign Application Priority Data

Mar. 16, 2021 (EP) .................................... 21162749

(51) Int. Cl.
*C30B 15/04* (2006.01)
*C30B 15/20* (2006.01)
*C30B 29/06* (2006.01)

(52) U.S. Cl.
CPC .............. *C30B 15/04* (2013.01); *C30B 15/20* (2013.01); *C30B 29/06* (2013.01)

(58) Field of Classification Search
CPC ......... C30B 15/02; C30B 15/14; C30B 29/06; Y10T 117/1056
See application file for complete search history.

(56) References Cited

U.S. PATENT DOCUMENTS 5,954,873 A 9/1999 Hourai et al.
6,217,649 B1 4/2001 Wallace, Jr. et al.
(Continued)

FOREIGN PATENT DOCUMENTS

CN 109306515 A 2/2019
EP 0170856 A1 2/1986
(Continued)

*Primary Examiner* — Robert M Kunemund
(74) *Attorney, Agent, or Firm* — LEYDIG, VOIT & MAYER, LTD.

(57) ABSTRACT

An apparatus produces a doped Czochralski crystal. The apparatus includes: a pressure vessel; a crucible in the pressure vessel for containing liquid silicon; and a second apparatus for doping the melt. The second apparatus includes: a housing; a reservoir vessel holding a dopant; a conveyor belt conveying the dopant; a third apparatus for shaping a dumped bed on the conveyor belt; and a pipe whose first end is accessible by the dopant from the conveyor belt and whose second end points in a direction of the liquid silicon and is closed off from the liquid silicon. The third apparatus has a half-pipe having a diameter smaller than a width of the conveyor belt, which is closed on one side, the other side being open, and is arranged over the conveyor belt such that the open side points in the direction of conveyance of the dopant.

13 Claims, 3 Drawing Sheets

(56) References Cited

U.S. PATENT DOCUMENTS

| | | | | |
|---|---|---|---|---|
| 2004/0226504 | A1* | 11/2004 | Nakashima | C30B 29/06 117/208 |
| 2013/0098290 | A1* | 4/2013 | Luter | C30B 15/12 117/214 |
| 2013/0220215 | A1* | 8/2013 | Eidelman | C30B 15/002 117/214 |
| 2015/0107509 | A1 | 4/2015 | Fukuda | |
| 2015/0259821 | A1* | 9/2015 | Kwon | C30B 15/12 117/214 |

FOREIGN PATENT DOCUMENTS

| | | | | |
|---|---|---|---|---|
| EP | 0537988 | A1 * | 4/1993 | C30B 15/02 |
| EP | 1338682 | A2 * | 8/2003 | B07B 13/04 |
| WO | WO 2009113441 | A1 | 9/2009 | |
| WO | WO 2014141309 | A1 | 9/2014 | |
| WO | WO 2020123074 | A1 | 6/2020 | |

* cited by examiner

APPARATUS AND METHOD FOR PRODUCING A DOPED MONOCRYSTALLINE ROD MADE OF SILICON

CROSS REFERENCE TO RELATED APPLICATIONS

This application is a U.S. National Phase application under 35 U.S.C. § 371 of International Application No. PCT/EP2022/055672, filed on Mar. 7, 2022, and claims benefit to European Patent Application No. EP21162749, filed on Mar. 16, 2021. The International Application was published in German on Sep. 22, 2022 as WO 2022/194586 A1 under PCT Article 21(2).

FIELD

The present disclosure relates to a process for producing a monocrystalline ingot of silicon, which may include the melting of polysilicon in a crucible, doping of the silicon, and pulling of a single crystal on a seed crystal from a melt heated in a crucible, according to the Czochralski method.

BACKGROUND

Monocrystalline silicon, the starting material for the majority of methods for producing electronic semiconductor components, is produced typically by the Czochralski method ("CZ"). In this method, polycrystalline silicon ("polysilicon") is introduced into a crucible and melted, a seed crystal is brought into contact with the melted silicon, and a single crystal is grown by slow extraction.

The crucible consists, typically, of a silicon dioxide-containing material such as quartz. It is filled in general with chunks and/or with granules of polycrystalline silicon, which is melted by means of a side heater disposed around the crucible and a bottom heater disposed beneath the crucible. After a phase for the thermal stabilization of the melt, a monocrystalline seed crystal is immersed into the melt and lifted. In this procedure, silicon crystallizes on the end of the seed crystal wetted by the melt. The crystallization rate is influenced substantially by the velocity with which the seed crystal is lifted (crystal lifting velocity) and by the temperature at the interface at which melted silicon crystallizes. Through suitable control of these parameters, a portion referred to as the "neck" is pulled first, in order to eliminate dislocations, then a conical portion of the single crystal, and lastly a cylindrical portion of the single crystal, from which the semiconductor wafers are subsequently taken.

As described, for example in U.S. Pat. No. 5,954,873 A, the corresponding operating parameters of the crystal pulling process are adjusted such that the resultant defect distribution in the crystal is radially homogeneous.

Care is taken in particular to ensure that agglomerates of vacancies, also referred to as COPs (crystal originated particles), are formed, if at all, only below the detection limit. The detection limit for COPs is taken below to be a density of 1000 defects/$cm^3$.

At the same time, care is taken to ensure that agglomerates of interstitial silicon atoms, called LPITs, occur, if at all, only below the detection limit. The detection limit is taken below to be a density of LPITs of 1 defect/$cm^2$.

In certain applications, an amount of dopant is added to the melt, in order to achieve a desired specific resistance (resistivity) in the silicon crystal. The dopant, conventionally, is introduced into the melt from a filling hopper located a number of meters above the level of the silicon melt. For volatile dopants, however, this procedure is unfavorable, as such dopants have a tendency toward uncontrolled evaporation into the surrounding environment, and this may lead to the formation of oxide particles (i.e., suboxides), which may fall into the melt and become incorporated into the growing crystal. These particles may act as heterogeneous nucleation sites and lead ultimately to the failure of the crystal pulling operation by causing, for example, dislocations.

Certain known dopant systems introduce volatile dopants in gas form into the growth chamber. Such systems, however, must be topped up manually each time a doping procedure is performed. Moreover, such systems cannot be topped up during operation. As a consequence of this, such systems have a limited dopant payload for an individual growth operation. Such systems therefore limit the size of silicon blocks which can be grown. Furthermore, such systems tend to supply dopant in an uncontrolled way during a growth operation, thereby increasing the variation in the dopant concentration in an uncontrolled way along the lengthwise axis of a grown ingot.

WO 2009/113 441 A1 describes a process and an apparatus for doping silicon, wherein dopant is sublimed and is supplied in gas form to the melt.

WO 2014/141 309 A1 describes a crystal pulling apparatus, which comprises a dopant supply system comprising a dopant conduit equipped with a specific chamber system, so that solid dopant cannot fall into the melt but gaseous dopant can access the melt.

WO 2020/123 074 A1 represents an onward development of the preceding specification, comprising, rather than the chamber system used, a porous separating element which is mounted in the dopant conduit. The porous separating element prevents solid dopant granules, which move vigorously in the course of sublimation, escaping from the chamber system, with the possible consequence that they fall into the melt and may, firstly, detract from the consistency of the dopant operation and may, secondly, form particles which lead to dislocation of the crystal.

The specification EP 0170 856 A1 describes an apparatus for the recharging of a crucible with silicon during crystal pulling, using a conveyor belt. The disadvantage of this arrangement is that the amount of further silicon added may vary, and it is therefore unsuitable for use as a recharging unit for dopant.

As recognized by the present inventors, there exists, consequently, a need for improved dopant supply systems for the doping of a silicon melt for producing a doped silicon block by the Czochralski method.

SUMMARY

In an embodiment, the present disclosure provides an apparatus that produces a doped Czochralski crystal. The apparatus includes: a pressure vessel; a crucible located in the pressure vessel and configured to contain a melt of liquid silicon; and an apparatus for doping the melt. The apparatus for doping the melt includes: a housing; a reservoir vessel for holding a dopant; a conveyor belt for conveying the dopant; an apparatus for shaping a dumped bed on the conveyor belt; and a pipe whose first end is accessible by the dopant from the conveyor belt and whose second end points in a direction of the liquid silicon and is closed off from the liquid silicon with a porous separating element. The apparatus for shaping the dumped bed on the conveyor belt has a half-pipe having a diameter smaller than a width of the conveyor belt, the half-pipe being closed on one side, the other side being open, and being arranged over the conveyor belt in such a way that the open side points in the direction of conveyance of the dopant.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Aspects of the present disclosure provide a process and an apparatus that enable the production of a monocrystalline ingot by means of the Czochralski pulling method, where the axial variation of the dopant is minimal.

The features indicated in relation to the recited embodiments of the process of the present disclosure may be transposed correspondingly to the products of the present disclosure. Conversely, the features indicated in relation to the recited embodiments of the products of the present disclosure may be transposed correspondingly to the process of the present disclosure. These and other features of the embodiments according to the present disclosure are elucidated in the description of the figures and in the claims. The individual features may be realized either separately or in combination as embodiments of the present disclosure. They may also describe advantageous configurations which have independent capacity for protection. An apparatus for pulling a doped Czochralski crystal, and enabling continuous metered addition of dopant during pulling, comprises an apparatus for pulling a crystal by the method of Czochralski.

Figure 1:
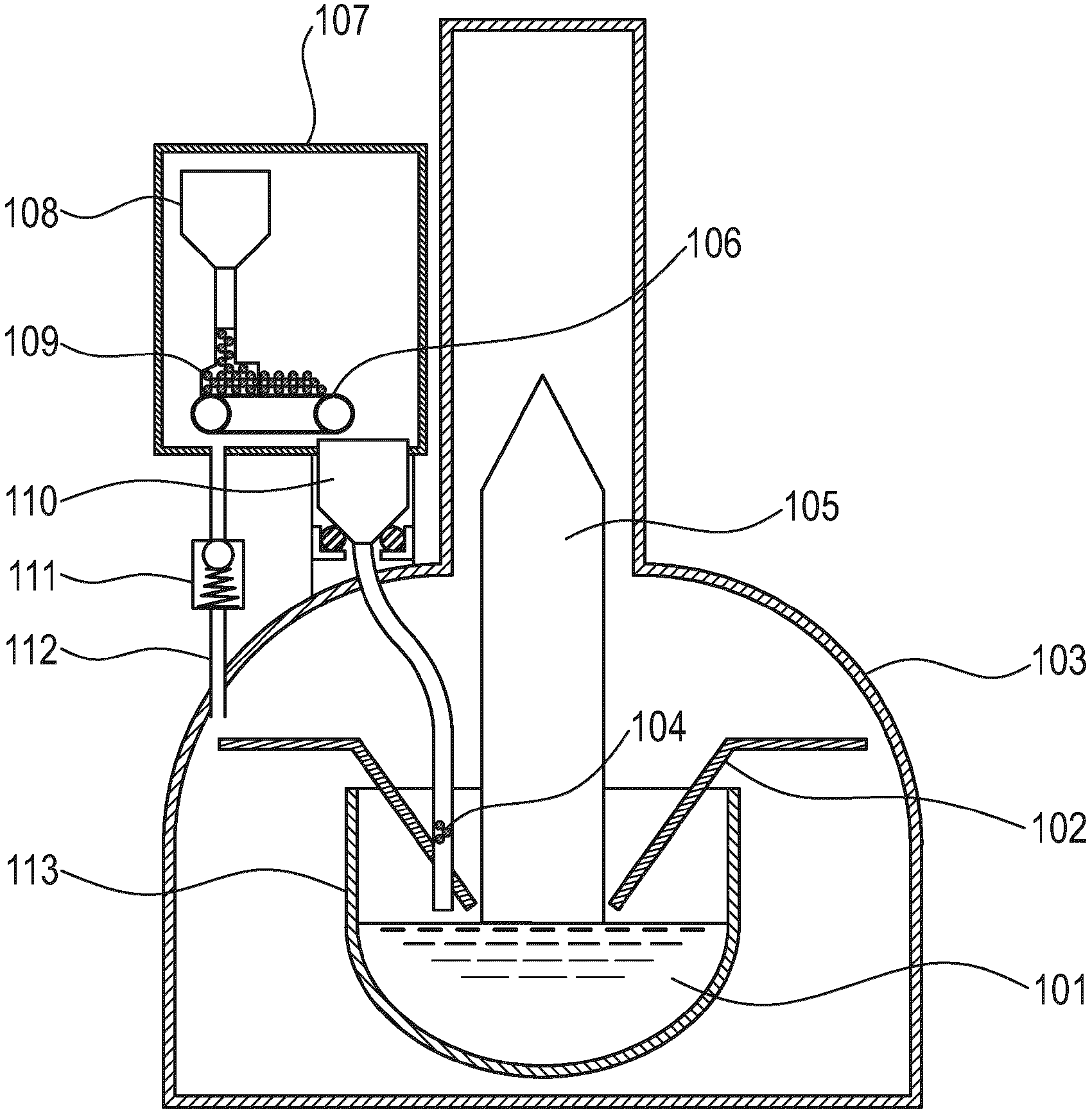
FIG. 1 shows an arrangement implemented according to aspects of the present disclosure for continuous doping of silicon.

FIG. 1 shows an arrangement implemented according to aspects of the present disclosure for continuous doping of silicon. In particular, FIG. 1 illustrates a Czochralski crystal pulling unit that comprises a crucible (113), which is full of liquid silicon (101) and is located in a pressure vessel (103). The crystal (105) is pulled from the melt (101), with one or more heat shields (102) confining the radiant heat. The doping of the melt (101) is accomplished by the conveying of dopant from a reservoir vessel (108), which is located in a housing (107), by way of a conveyor belt (106) into a collecting hopper (110), from which it falls by way of a pipe onto a porous separating element (104). The conditions prevailing at the position at which the porous separating element (104) is located are such as to lead to sublimation of the dopant. The gas obtained in this way dopes the liquid silicon and hence the crystal. Mounted over the conveyor belt is an apparatus for shaping the dumped bed on the conveyor belt (109), which shapes a well-defined dumped cone of the dopant on the conveyor belt (106), without causing additional contamination as it does so. By way of an additionally mounted compensating valve (111) in a gas line between pressure vessel and housing (112), it is possible optionally to perform a pressure equalization between housing and pressure vessel.

As shown in FIG. 1, the crystal (105) is pulled from the melt (101), with one or more heat shields (102) confining the radiant heat. The doping of the melt (101) is accomplished by the conveying of the dopant from a reservoir vessel (108), which is located in a housing (107), by way of a conveyor belt (106) into a collecting hopper (110), from which it falls via a pipe onto a porous separating element (104).

A feature of implementations according to aspects of the present disclosure is a conveyor belt (106). Its function is to convey dopant. The dopant, preferably arsenic, may more preferably consist of chunks having a suitable particle size distribution, or alternatively may consist of granules or suitable compounds of arsenic such as, for example, arsenic silicides, arsenic oxides, or arsenates. Further preferred dopants include the following: Selenium (Se), and Bismuth (Bi).

The belt material of the conveyor belt is constructed preferably such that it is functional in the environment of the pulling unit. More particularly the functionality is chemically resistant to the selected dopant compound under vacuum (down to 10 mbar), at radiation temperatures of up to 150° C., and ought to emit neither particles nor volatile substances. The inventors have recognized that the belt materials preferred in this context consist of dry fluoro rubbers.

The function is enabled by a drive, which takes place by means of a motor, which is disposed more preferably outside of the vacuum region of the pulling unit.

The driving force is transmitted by means of a shaft, which is designed as a rotary passage for vacuum. The drive motor itself is configured preferably as an electric motor, more preferably as what is called a stepper motor. The torque is increased preferably by a transmission. The transmission may be configured preferably by means of gear wheels; equally possible is a chain-driven or a belt drive.

Figure 2:
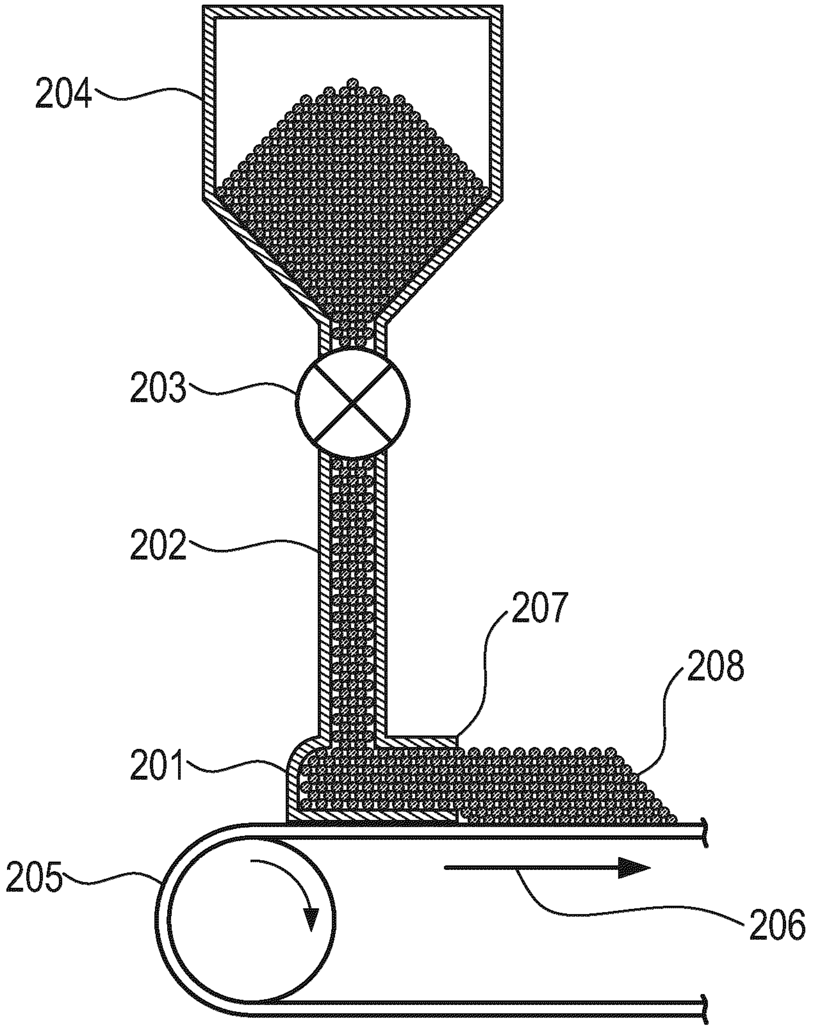
FIG. 2 shows the reservoir vessel in communication with a dumped bed of a conveyor belt via a shutoff apparatus and a connecting pipe.

FIG. 2 shows the reservoir vessel (204), which is full of dopant. By way of a shutoff apparatus (203), the dopant is able to access a connecting pipe (202) to the apparatus for shaping the dumped bed on the conveyor belt (201), this apparatus ensuring that a well-defined dumped bed of the dopant (208) is formed on the conveyor belt (205). The open side of the half-pipe of the apparatus for shaping the dumped bed on the conveyor belt (207) points here in the running direction of the conveyor belt (206).

An apparatus for shaping the dumped bed on the conveyor belt (109) is critical for the flow of the dopant and for the cross section of the resultant dumped bed (208). Integrated for assembly purposes, with particular preference, is the shutoff apparatus (203), which can be used to stop the continued flow of dopant. The configuration is a control means with on/off limitation, configured preferably as a tap or slide.

The inside diameter of the pipe conduits must be sufficiently large to enable a flow of the dopant without stoppages. In the case of granules, for example, this diameter is at least five times the diameter of the largest particle size of the specified particle size distribution.

A continual movement of the conveyor belt transports dopant, which is caused to continue flowing via a pipe. In an installation (109, 201) dictating the cross section, it is ensured that a dumped bed (208) is formed that, over its entire length, has a maximum degree of uniformity in cross section and thereby ensures a linear correlation between rate of advance and doping mass. The start and end of the dumped bed, for which this correlation is not yet linear or is no longer linear, should not be more than 20% of the length of the dumped bed.

The inventors have recognized that it is particularly advantageous if the apparatus for shaping the dumped bed on the conveyor belt is a half-pipe whose diameter is smaller than the width of the conveyor belt. It is particularly important here that the apparatus is closed on one side, the other side being open, and is arranged over the conveyor belt in such a way that the open side points in the direction of the conveyance of the dopant. This ensures that the dopant can be transported without significant additional contamination and that the shape of the formed dumped bed of dopant has the maximum possible uniformity over its entire length.

The position of the apparatus for shaping the dumped bed is preferably set over the conveyor belt in such a way that the minimum distance from the conveyor belt is less than the lower limit of the particle size distribution of the dopant. On the one hand this prevents granules becoming stuck between apparatus and conveyor belt, and on the other hand it also prevents dopant falling down past the conveyor belt.

The bottom edge of the apparatus for shaping the dumped bed here is preferably configured such that in the direction of conveyance it forms, with the conveyor belt, a minimal open angle of less than 3°, more preferably less than 1°.

The apparatus for shaping the dumped bed is more preferably fabricated from borosilicate glass (laboratory glass, e.g. Duran®).

The reservoir vessel (108) contains a reservoir of dopant. The mass of the reservoir corresponds at least to the mass required for the pulling operation.

The reservoir vessel is preferably designed to be suitable for filling at a toxicologically flawless filling station. Ideally it additionally takes account of the particular requirements of purity (metals) and clean room (particles).

The preferred construction material for the reservoir vessel is borosilicate glass (laboratory glass, e.g. Duran®). With particular preference not only the reservoir vessel (108) but also the shutoff facility (203) and the apparatus for shaping the dumped bed (109) have a one-piece configuration.

The housing (107) is an extension of the vacuum region of the pulling unit. It allows the facilities described to be operated in the course of crystal pulling.

The housing (107) is designed more preferably with a water-carrying cooling system, for example in the form of a jacket. Windows for viewing moving parts facilitate operation and monitoring. All moving parts (conveyor belt, vacuum rotary passage, transmission, and drive motor) are attached mechanically to the housing.

Figure 3:
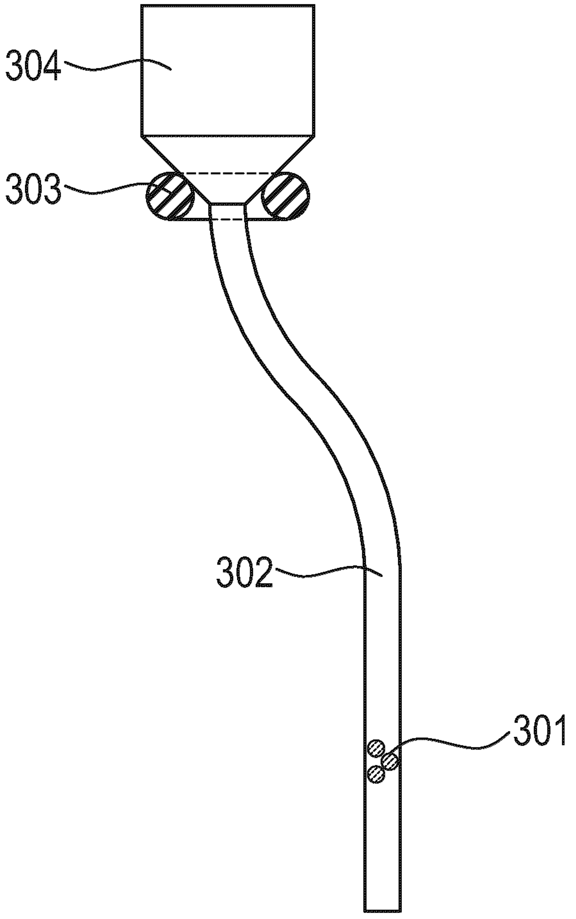
FIG. 3 shows the connection between the conveyor belt and the melt.

FIG. 3 shows the connection between the conveyor belt and the melt. The dopant falls from the conveyor belt into a collecting hopper (304), and, through a pipe (302), accesses a porous separating element (301), where it is able to sublime. The apparatus is held by a holding apparatus (303).

Located directly below the small conveyor belt, preferably, is a collecting facility (110), which may be configured as a collecting hopper, and which transitions into a pipe (302). The upper diameter of the collecting facility is preferably at least equal to the width of the dumped bed of dopant, preferably at least three times as great.

The diameter of the pipe (302) is preferably selected such that it does not lead to blockages in operation. This can be ensured by making the internal diameter of the pipe at least five times the upper limit of the particle size distribution of the dopant used.

The pipe (302) leads the downward trickle of dopant, initially still solid, into a defined region of the crystal pulling unit over the melt, at which the ambient conditions (pressure, temperature, and partial pressure of the vapor of the dopant) ensure sublimation of the dopant. The defined region of the crystal pulling unit is preferably selected such that the sublimation process can be monitored visually through a sightglass.

Installed between the region with the expanded diameter and the pipe is a holding apparatus for the pipe (303), and so the pipe may simply be secured there. The holding apparatus for the pipe (303) is preferably fabricated from a ring of polymer and has a gastight closure with the housing.

On the side of the pipe facing the melt, the pipe is sealed with a porous separating element (301), which prevents particles from accessing the melt but allows gases (sublimed dopant) to diffuse through.

The inventors have recognized that it is very important which material is used for this porous separating element. If, for example, as suggested in WO20123074 A1, an exclusively solid material is used, it is nevertheless possible for extremely small particles, probably formed on impact onto the solid barrier, to enter the melt through the porous separating element and lead in said melt to the dislocation of the crystal (and therefore to total failure).

The porous separating element (301) is therefore fabricated preferably from a wool made of silica glass. Very preferably the porous separating element (301) is fabricated on the silicon-facing side from a hard, porous material, preferably from fused quartz, and on the side facing away from the silicon from a wool of silica glass.

When the dopant has sublimed, its gas mixes with the in the already present gas, and said dopant is able to diffuse through the porous separating element (301) in the direction of liquid silicon.

The prevailing gas in a crystal pulling unit is, as a general rule, argon. Under certain circumstances, admixtures of nitrogen may also be present.

In a Czochralski crystal pulling unit, it is particularly important that the gas stream composed of oxygen and silicon ($Si_xO_y$) components given off from the liquid silicon is transported away as quickly as possible, since otherwise there may be deposits within the unit, and this could lead to problems on opening of the unit after the pulling of the crystal.

With preference, therefore, argon also serves as a carrier gas applied to the reservoir vessel and to the pipe. With particular preference a gas stream is established in the pipe that leads in the direction of the liquid silicon. This has two effects: firstly, no gases formed during crystal pulling are transported into the doping apparatus—here as well this could lead to problems on disassembly and recharging—and secondly it is ensured that no sublimed dopant flows back into the reservoir vessel or the pipe, with possible consequences including considerable toxicological risks (arsenic).

In the unwanted event of the pressure difference between the reservoir vessel and the pulling unit becoming too great, there is preferably an overpressure valve or a compensating valve installed for pressure equalization (111) in an additional line between reservoir vessel and pulling unit.

The side of the tube (302) that is facing the liquid silicon preferably below a heat shield (102). This allows the transport gas enriched with dopant to be brought into direct contact with the melt, since it is only in this way that a desired increase in concentration in the melt is brought about.

In order to prevent etching effects on the surface of the growing crystal (020) by the arsenic vapor, the end position of the guide pipe must not be too close to the crystal.

The inventors have recognized that the apparatus described for doping a crystal during Czochralski crystal pulling is particularly advantageous. The greatest economic benefit for the use of the apparatus comes about if the diameter of the crystal is greater than 250 mm.

Preferred practice is to pull a first crystal and to dope it during pulling, with the aid of the stated apparatus, with a first dopant, the velocity of the conveyor belt being correlated with the length of the growing crystal. This takes place preferably such that at predefined support points, which are located very particularly at the positions at which the crystal is later cut into ingot pieces, target velocities for the conveyor belt are stipulated first of all. The target values for the velocity of the conveyor belt outside the support points are interpolated.

The support points therefore form a two-tuple composed of the length of the crystal and the velocity of the conveyor belt.

When the first crystal has been pulled, the ingot is measured to determine its specific resistance. For this purpose it is preferably cut into ingot pieces whose end faces undergo a measurement of resistance.

The measured values obtained accordingly are compared with the desired profile of the resistance along its axis, and the difference between measurement value and desired value is formed.

This difference is subsequently used in order to use new, altered support points for the second crystal.

This process can with particular preference be repeated further, to produce crystals which are as close as possible to a desired profile of the resistance along the axis of the crystal.

The process wherein a second dopant is admixed to the polysilicon in the crucible is especially preferred. The process is therefore able, for example, to generate crystals which have a particularly flat axial resistance profile.

The first dopant is preferably arsenic. The second dopant more preferably comprises boron.

The crystals obtained in this way are preferably cut by means of a saw into ingot pieces, before they are cut by means of a wire saw into semiconductor wafers. The resulting semiconductor wafers are preferably polished and optionally provided with an epitaxially applied layer of silicon.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

ABBREVIATIONS

101 Silicon melt
102 Heat shield
103 Pressure vessel
104 Porous separating element
105 Crystal
106 Conveyor belt
107 Housing
108 Reservoir vessel
109 Apparatus for shaping the dumped bed on the conveyor belt
110 Collecting hopper, collecting facility
111 Compensating valve for pressure equalization
112 Gas line between pressure vessel and housing
113 Crucible
201 Apparatus for shaping the dumped bed on the conveyor belt
202 Connecting pipe
203 Shutoff apparatus
204 Reservoir vessel
205 Conveyor belt
206 Running direction of conveyor belt
207 Open side of the half-pipe of the apparatus for shaping the dumped bed on the conveyor belt
208 Dumped bed of dopant
301 Porous separating element
302 Pipe for transporting dopant
303 Holding apparatus for the pipe
304 Collecting hopper, collecting facility

What is claimed is:

1. An apparatus for producing a doped Czochralski crystal, the apparatus for producing the doped Czochralski crystal comprising:
- a pressure vessel;
- a crucible located in the pressure vessel and configured to contain a melt of liquid silicon; and
- an apparatus for doping the melt, the apparatus for doping the melt comprising:
  - a housing;
  - a reservoir vessel for holding a dopant;
  - a conveyor belt for conveying the dopant;
  - an apparatus for shaping a dumped bed on the conveyor belt; and
  - a pipe whose first end is accessible by the dopant from the conveyor belt and whose second end points in a direction of the liquid silicon and is closed off from the liquid silicon with a porous separating element, wherein the apparatus for shaping the dumped bed on the conveyor belt comprises a half-pipe having a diameter smaller than a width of the conveyor belt, the half-pipe being closed on one side, the other side being open, and being arranged over the conveyor belt in such a way that the open side points in the direction of conveyance of the dopant.

2. The apparatus as claimed in claim 1, wherein a minimum distance between the half-pipe and the conveyor belt is smaller than a minimum size of a particle size distribution of the dopant.

3. The apparatus as claimed in claim 1, wherein the apparatus for shaping the dumped bed on the conveyor belt is connected by a second pipe to the reservoir vessel and is configured to be closable by a shutoff apparatus so that a further flow of the dopant can be halted.

4. The apparatus as claimed in claim 1, wherein the conveyor belt is constructed of dry fluoro rubbers.

5. The apparatus as claimed in claim 1, wherein the porous separating element consists of fused quartz wool.

6. The apparatus as claimed in claim 1, wherein the housing comprises a water-carrying cooling system.

7. The apparatus as claimed in claim 1, wherein the apparatus for shaping the dumped bed has been fabricated from borosilicate glass.

8. A process for producing a doped monocrystalline ingot of silicon, the process comprising:

pulling a first crystal from a crucible in a Czochralski pulling unit;

doping the first crystal using the apparatus for producing the doped Czochralski crystal according to a 1 with a first dopant, the velocity of the conveyor belt being set such that it follows predefined support points consisting of a 2-tuple formed from target velocity and length of the pulled first crystal;

determining an axial resistance profile of the first crystal;

modifying a target velocity of the predefined support points in accordance with the axial resistance profile of the first crystal; and pulling a second crystal using the modified support points.

9. The process as claimed in claim 8, wherein the pulling of the first crystal and the pulling of the second crystal is preceded in each case by filling the crucible with polysilicon which is admixed with a predefined amount of a second dopant.

10. The process as claimed in claim 9, wherein the first dopant comprises primarily arsenic and the second dopant comprises primarily boron.

11. The process as claimed in claim 9, wherein the second crystal is cut into ingot pieces, a position of the cuts corresponding to the positions of the predefined support points.

12. The process as claimed in claim 9, wherein the second crystal is pulled such that it has a diameter of greater than 250 mm.

13. The process as claimed in claim 11, wherein the ingot pieces are cut by a wire saw into semiconductor wafers, and are polished.

* * * * *